(12) United States Patent
Kim et al.

(10) Patent No.: US 7,863,177 B2
(45) Date of Patent: Jan. 4, 2011

(54) FUSE IN A SEMICONDUCTOR DEVICE AND METHOD FOR FABRICATING THE SAME

(75) Inventors: Jeong Soo Kim, Icheon-Si (KR); Won Ho Shin, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/341,954

(22) Filed: Dec. 22, 2008

(65) Prior Publication Data

US 2010/0096722 A1    Apr. 22, 2010

(30) Foreign Application Priority Data

Oct. 22, 2008    (KR) ...................... 10-2008-0103760

(51) Int. Cl.
*H01L 21/768*    (2006.01)

(52) U.S. Cl. .................. 438/601; 257/E21.592

(58) Field of Classification Search .............. 438/132, 438/215, 281, 333, 467, 601; 257/529, 530, 257/E23.01, 209, E21.592, E23.149
See application file for complete search history.

(56) References Cited

U.S. PATENT DOCUMENTS

| 6,756,655 | B2 | 6/2004 | Le et al. | |
| 2002/0027291 | A1* | 3/2002 | Yokoyama | .................. 257/773 |
| 2007/0013025 | A1* | 1/2007 | Mun | .......................... 257/529 |

FOREIGN PATENT DOCUMENTS

JP        2008-198939 A        8/2008

* cited by examiner

*Primary Examiner*—Matthew S Smith
*Assistant Examiner*—Daniel Shook
(74) *Attorney, Agent, or Firm*—Marshall, Gerstein & Borun LLP

(57) ABSTRACT

The present invention relates to a fuse in a semiconductor device and method for fabricating the same. An oxide film is formed on sidewalls of a barrier metal layer in a bottom portion of a fuse pattern, thereby preventing the barrier metal layer from being exposed. As a result, the oxidation of the barrier metal layer is inhibited to improve characteristics of the device.

11 Claims, 5 Drawing Sheets

FUSE IN A SEMICONDUCTOR DEVICE AND METHOD FOR FABRICATING THE SAME

CROSS-REFERENCE TO RELATED APPLICATION

Priority to Korean patent application number 10-2008-0103760, filed on Oct. 22, 2008, the entire disclosure of which is incorporated by reference, is claimed.

BACKGROUND OF THE INVENTION

The invention relates to a fuse of a semiconductor device, and a method for fabricating the same.

If at least one memory cell of a memory array of a semiconductor device has a defect in the manufacturing of the semiconductor device, the whole device does not serve as a memory, so that the whole device is defective.

However, although there is a defect in one memory cell of the memory device, the whole device is regarded as being defective and discarded, thereby decreasing the device yield.

To overcome this problem, presently, the semiconductor device is designed with redundancy cells, so that a defective cell may be replaced with a redundancy cell, resulting in repair of the whole memory, and thereby improving yield.

In a repair method using a redundancy cell, each cell array comprises a redundancy word line that substitutes a normal word line and a redundancy bit line that substitutes a normal bit line, and when a defect is generated in a specific cell, the normal word line or the normal bit line is substituted with the redundancy word line or the redundancy bit line.

In the memory device, when a defective cell is found through a test after wafer processing, a circuit is comprised to substitute an address corresponding to the defective cell with an address corresponding to the redundancy cell.

As a result, when an address signal corresponding to the defective cell is inputted, data contained in the substituted redundancy cell corresponding to the defective cell is accessed.

Of the above-described repair methods, a widely used method is to burn a fuse with a laser beam and blow the fuse, thereby substituting the path of an address.

A general memory device comprises a fuse unit configured to substitute an address path by irradiating a laser to the fuse to blow the fuse. A wire disconnected by laser irradiation is referred to as a metal fuse, and the disconnected site and its surrounding region are referred to as a fuse box.

In the conventional art, a blowing process is performed while an oxide film remains on the fuse. However, the thickness of the residual oxide film is not uniform, so that the blowing of the fuse is not performed normally, thereby decreasing the yield of the device. Specifically, after introduction of the metal fuse, the reduction of the yield of the device has been increased over an admission range.

In order to solve the above problem, a bare fuse that does not comprise an oxide film over the fuse has been suggested.

FIGS. 1a to 1d are cross-sectional diagrams illustrating a conventional method for forming a bare fuse of a semiconductor device.

Referring to FIG. 1a, a first insulating film 105 is formed over a semiconductor substrate 100 including a lower structure.

A first barrier metal layer 110, a metal layer 115 and a second barrier metal layer 120 are sequentially formed over the first insulating film 105.

The first barrier metal layer 110 and the second barrier metal layer 120 comprise one selected from the group consisting of a titanium (Ti) film and a titanium nitride (TiN) film. The metal layer 109 comprises aluminum.

The second barrier metal layer 120, the metal layer 115 and the first barrier metal layer 110 are patterned to form a plurality of fuse patterns 125.

Referring to FIG. 1b, an oxide film 130 is formed over the fuse pattern 125 and the first insulating film 105, and a second insulating film 135 is formed over the fuse pattern 125 and the first insulating film 105.

A passivation layer 140 is formed over the second insulating film 135. The passivation layer 140 comprises one selected from the group consisting of an oxide film and a nitride film.

Referring to FIGS. 1c and 1d, the passivation layer 140 and the second insulating film 135 are etched by an etching process with a repair mask to form a fuse open region 150 that exposes the fuse pattern 125.

The top portion of the fuse pattern 125 is further etched so that the thickness of the fuse pattern 125 becomes thinner. The second barrier metal layer 120 is completely removed, and the top portion of the metal layer 115 is partially etched. When the thickness of the fuse pattern 125 is too thick, blowing is not normally performed. As a result, since the fuse pattern 125 is not suitable to be used as a fuse, the top portion of the fuse pattern 125 is etched so that the thickness may become thinner.

The first insulating film 105 is partially etched, and the first barrier metal layer 110 formed in the bottom portion of the fuse pattern 125 as shown in 'A' is completely open. The first barrier metal layer 110 is oxidized in a subsequent process to change its property. As a result, the resistance of the first barrier metal layer 110 becomes higher. However, when the resistance is increased, the fuse which is not cut is recognized as being cut in a reliability test. While the first barrier metal layer 110 is oxidized, the volume is expanded so that the metal layer 115 formed over the first barrier metal layer 110 becomes loose.

BRIEF SUMMARY OF THE INVENTION

Various embodiments of the disclosure are directed at providing a fuse of a semiconductor device and a method for fabricating the same.

According to an embodiment of the invention, a method for fabricating a fuse of a semiconductor device comprises: forming a barrier metal layer and a metal layer over a first insulating film; patterning the metal layer and the barrier metal layer to form a fuse pattern; etching sidewalls of the patterned barrier metal layer to form an undercut; forming a protective film that fills the undercut; forming a second insulating film over the protective film; and selectively etching the first insulating film and the second insulating film to form a fuse open region.

The first insulating film and the second insulating film comprise oxide film, and the protective film comprises an oxide film.

The barrier metal layer comprises one selected from the group consisting of a titanium (Ti) film and a titanium nitride (TiN) film. The metal layer comprises aluminum.

The width of the undercut ranges from about 40 Å to about 60 Å.

The forming-a-protective-film comprises forming a protective film over the fuse pattern including the first insulating film and the undercut. The forming-a-fuse-open-region comprises etching the protective film with the fuse pattern as a barrier so that the protective film remains on the undercut.

A passivation layer is further comprised over the second insulating film. The passivation layer comprises one selected from the group consisting of an oxide film and a nitride film.

The method further comprises etching the upper portion of the fuse pattern.

According to an embodiment of the invention, a fuse of a semiconductor device comprises: a fuse pattern including an undercut; and a protective film filled in the undercut.

The fuse pattern comprises a metal layer and a barrier metal layer. The metal layer comprises aluminum. The barrier metal layer comprises one selected from the group consisting of a titanium (Ti) film and a titanium nitride (TiN) film.

The width of the undercut ranges from 40 Å to 60 Å. The undercut is formed in the barrier metal layer. The protective film comprises an oxide film.

DESCRIPTION OF SPECIFIC EMBODIMENTS

FIGS. 2a to 2e are cross-sectional diagrams illustrating a fuse of a semiconductor device according to an embodiment of the invention.

Figure 1A:
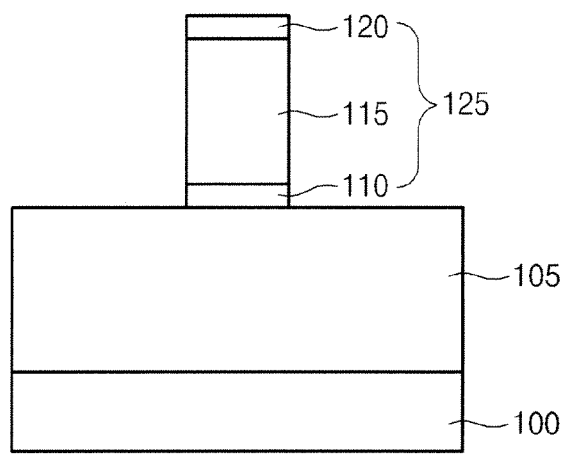
FIGS. 1a to 1d are cross-sectional diagrams illustrating a conventional method for forming a fuse of a semiconductor device.
Figure 1B:
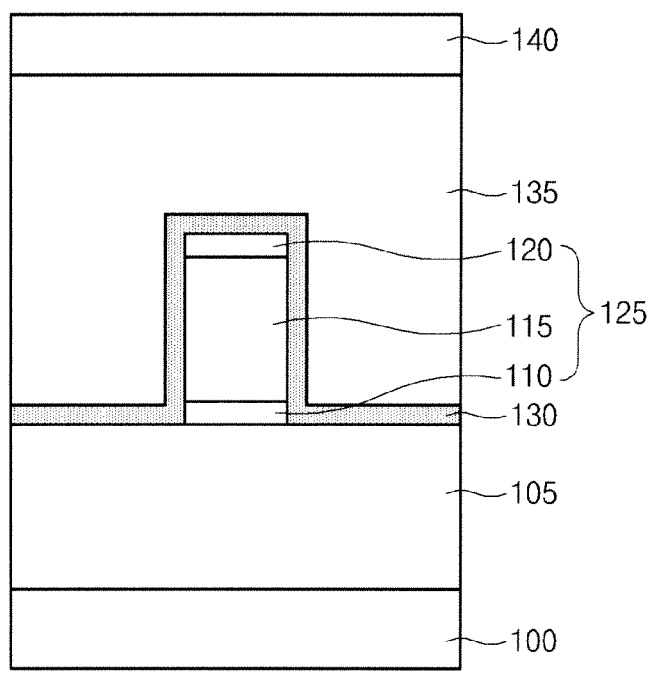
Figure 1C:
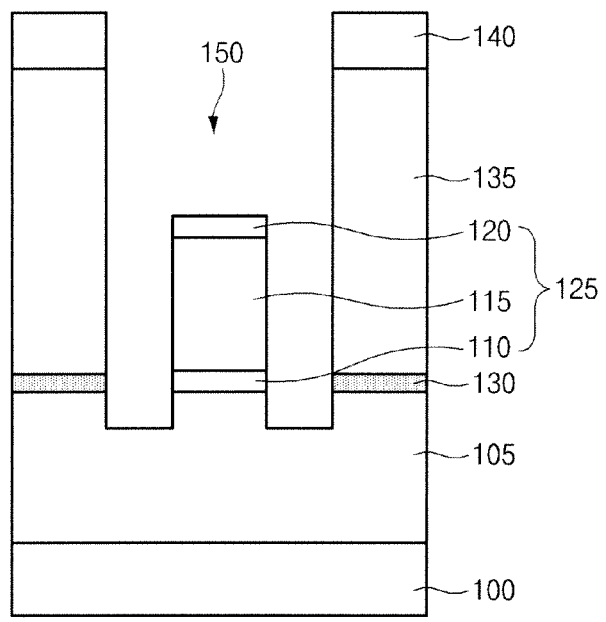
Figure 1D:
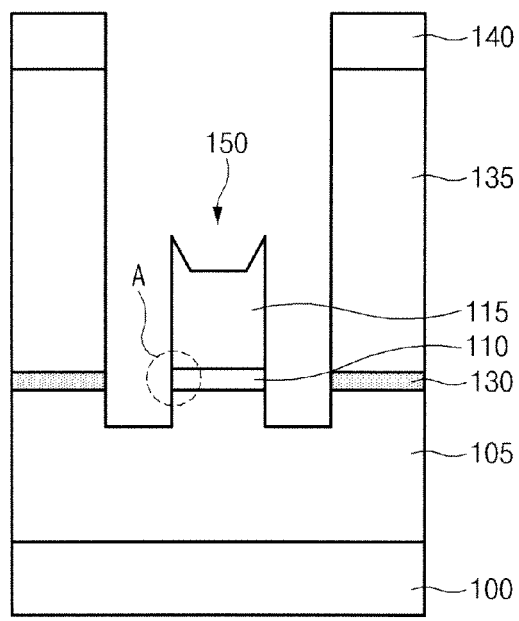
Figure 2A:
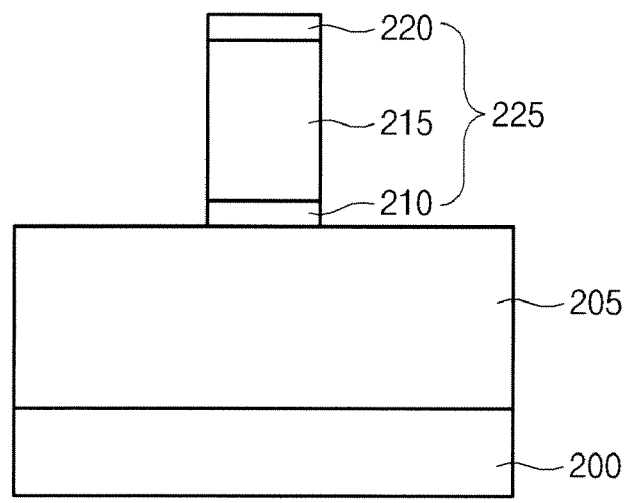
FIGS. 2a to 2e are cross-sectional diagrams illustrating a fuse of a semiconductor device according to an embodiment of the invention.

Referring to FIG. 2a, a first insulating film 205 is formed over a substrate 200 including a lower structure. The first insulating film 205 comprises an oxide film which has a thickness ranging from about 10000 Å to about 15000 Å.

A first barrier metal layer 210, a metal layer 215 and a second barrier metal layer 220 are formed over the first insulating film 205. The first barrier metal layer 210 and the second barrier metal layer 220 comprise one selected from the group consisting of a titanium film and a titanium nitride film. The metal layer 215 comprises an aluminum layer.

The second barrier metal layer 220, the metal layer 215 and the first barrier metal layer 210 are sequentially patterned to form a plurality of fuse patterns 225.

Figure 2B:
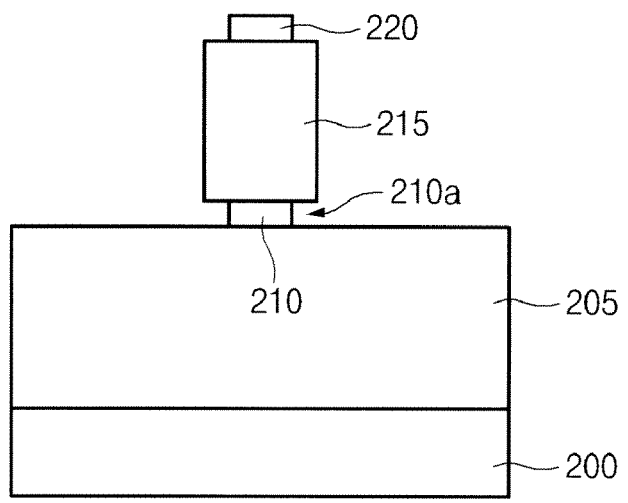

Referring to FIG. 2b, sidewalls of the first barrier metal layer 210 are etched to form an undercut 210a. The undercut 210a has a width ranging from about 40 Å to about 60 Å. The top portion and sidewalls of the second barrier metal layer 220 are partially etched. That is, the width of the metal layer 215 is smaller than that of the first barrier metal layer 210.

Figure 2C:
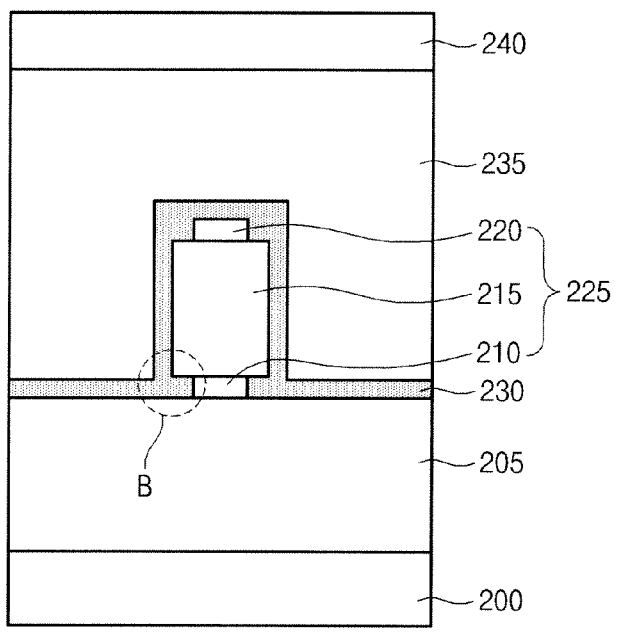

Referring to FIG. 2c, a protective film 230 is formed over the first insulating film 205 and the fuse pattern 225. The protective film 230 is completely filled in the undercut 210a as shown in 'B'. The protective film 230 comprises an oxide film.

A second insulating film 235 is formed over the first insulating film 205 and the fuse pattern 225. The second insulating film 235 comprises an oxide film to have a thickness ranging from about 10000 Å to about 15000 Å.

A passivation layer 240 is formed over the second insulating film 235. The passivation layer 240 comprises one selected from the group consisting of a nitride film and an oxide film to have a thickness ranging from about 2000 Å to about 4000 Å.

Figure 2D:
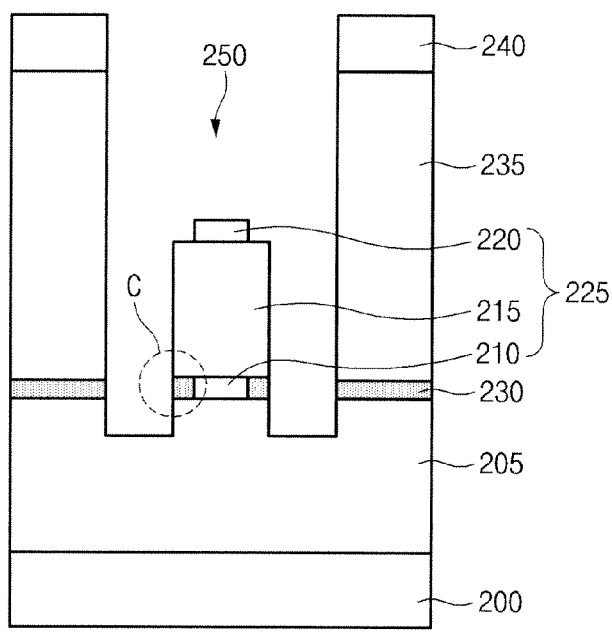

Referring to FIG. 2d, a photoresist film (not shown) is formed over the passivation layer 240.

An exposing process is performed on a photoresist film (not shown) with a repair mask, thereby forming a photoresist pattern (not shown) that defines a fuse open region.

The passivation layer 240 and the second insulating film 235 are etched with the photoresist pattern (not shown) as an etching mask, thereby forming a fuse open region 250 that exposes a fuse pattern 255. An over-etching process is performed to etch a portion of the first insulating film 205 and the protective film 230 located in the bottom portion at both sides of the fuse pattern 225. The protective film 230 formed over the fuse pattern 225 is removed, and the protective film 230 located at the side surface of the first barrier metal layer 210 remains as shown in 'C'. The etching process is performed by an etch-back method so that the protective film 230 corresponds to the area inside rather than sidewalls of the fuse pattern 225 based on the sidewalls of the fuse pattern 225.

Figure 2E:
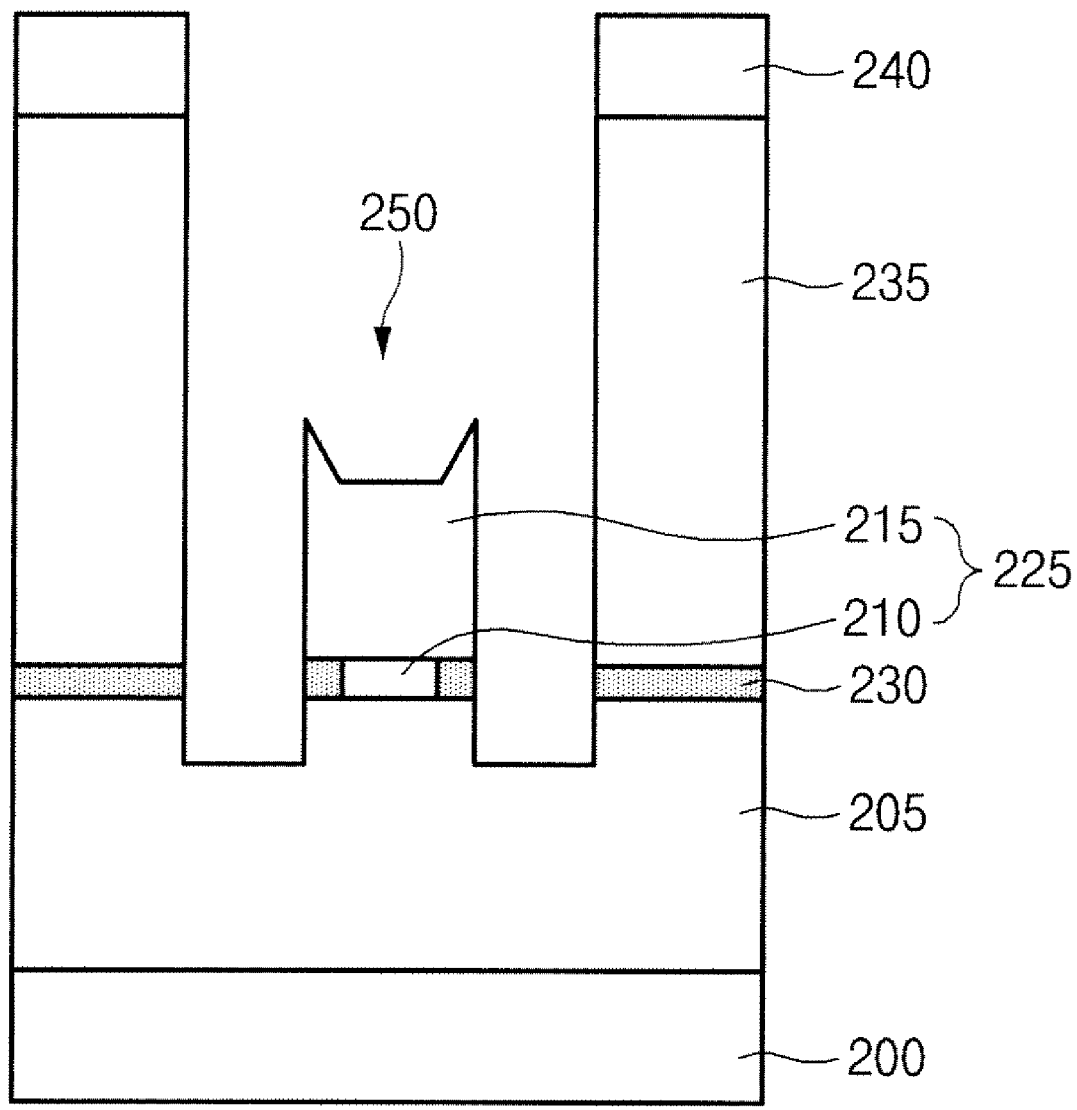

Referring to FIG. 2e, the photoresist pattern (not shown) is removed, and the top portion of the fuse pattern 225 is etched so that the fuse pattern 225 is thinner. When the thickness of the fuse pattern 225 is too thick, blowing is not normally performed, and the fuse pattern 225 is not suitable to be used as a fuse. As a result, the top portion of the fuse pattern 225 is etched so that the fuse pattern 225 is thinner.

When the top portion of the fuse pattern 225 is etched, the second barrier metal layer 220 positioned at the top portion of the fuse pattern 225 is removed, and the top portion of the metal layer 215 is partially etched. In the patterning process to form the fuse pattern 225, the inside of the metal layer 215 is further etched further than the edge of the metal layer 215 by an $Al_2O_3$ film formed at sidewalls of the metal layer 215.

The first insulating film 205 which is partially etched in the process shown in FIG. 2d is etched further.

The fuse pattern 225 becomes exposed by the etching process of the second insulating film 235 and the first insulating film 205. The sidewalls of the first barrier metal layer 210 are protected by the protective film 230, thereby preventing oxidation of the first barrier metal layer 210.

FIG. 2d shows a fuse of a semiconductor device according to an embodiment of the invention.

The first insulating film 205 is formed over the semiconductor substrate 200, and the fuse pattern 225 including an undercut is formed over the first insulating film 205. The undercut is filled with the protective film 230 that comprises an oxide film.

The fuse pattern 225 comprises the first barrier metal layer 210, the metal layer 215 and the second barrier metal layer 220. The undercut is formed in the first barrier metal layer 210 formed in the bottom portion of the metal layer 215. The first barrier metal layer 210 and the second barrier metal layer 220 comprise one selected from the group consisting of a titanium film and a titanium nitride film. The metal layer 215 comprises an aluminum layer.

The second insulating film 235 that defines a fuse open region is formed over the fuse pattern 225. The fuse open region is formed to open the fuse pattern 225 completely. The first barrier metal layer 210 is not exposed externally by the protective film 230, thereby preventing oxidation of the first barrier metal layer 210 in a subsequent process.

As described above, in a fuse of a semiconductor device and a method for fabricating the same according to an embodiment of the invention, an oxide film is formed at sidewalls of a barrier metal layer positioned at a bottom portion of a fuse pattern, thereby preventing the barrier metal layer from being exposed. As a result, the oxidation of the barrier metal layer is inhibited.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A method for fabricating a fuse of a semiconductor device, the method comprising:
    forming a barrier metal layer and a metal layer over a first insulating film;
    patterning the metal layer and the barrier metal layer to form a fuse pattern;
    etching sidewalls of the patterned barrier metal layer to form an undercut;
    forming a protective film that fills the undercut;
    forming a second insulating film over the protective film, the fuse pattern and the barrier metal; and
    selectively etching the first insulating film and the second insulating film to form a fuse open region.

2. The method according to claim 1, wherein the first insulating film and the second insulating film comprise oxide films.

3. The method according to claim 1, wherein the protective film comprises an oxide film.

4. The method according to claim 1, wherein the barrier metal layer comprises one selected from the group consisting of a titanium (Ti) film and a titanium nitride (TiN) film.

5. The method according to claim 1, wherein the metal layer comprises aluminum.

6. The method according to claim 1, wherein the width of the undercut ranges from about 40 Å to about 60 Å.

7. The method according to claim 1, wherein the forming-a-protective-film comprises forming a protective film over the fuse pattern including the first insulating film and the undercut.

8. The method according to claim 1, wherein the forming-a-fuse-open-region comprises etching the protective film with the fuse pattern as a barrier so that the protective film remains on the undercut.

9. The method according to claim 1, wherein a passivation layer is further comprised over the second insulating film.

10. The method according to claim 9, wherein the passivation layer comprises one selected from the group consisting of an oxide film and a nitride film.

11. The method according to claim 1, further comprising etching the upper portion of the fuse pattern.

* * * * *